(12) United States Patent  
Fiedler et al.

(10) Patent No.: US 6,490,325 B1  
(45) Date of Patent: Dec. 3, 2002

(54) TRANSMISSION CIRCUIT HAVING AN INDUCTOR-ASSISTED TERMINATION

(75) Inventors: Alan S. Fiedler, Minneapolis, MN (US); Michael O. Jenkins, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/164,245

(22) Filed: Sep. 30, 1998

Related U.S. Application Data

(60) Provisional application No. 60/068,272, filed on Dec. 19, 1997.

(51) Int. Cl.$^7$ ............................. H04B 3/00; H04L 25/00
(52) U.S. Cl. ........................................ 375/257; 333/124
(58) Field of Search .......................... 375/257; 333/124, 333/32, 33, 17.1, 17.3

(56) References Cited

U.S. PATENT DOCUMENTS 5,274,671 A * 12/1993 Johnson ..................... 375/36
5,321,372 A    6/1994 Smith ........................... 333/1
5,365,197 A * 11/1994 Ikalainen .................... 330/286
5,491,402 A *  2/1996 Small .......................... 323/282
5,550,496 A    8/1996 Desroches ................... 327/108
5,677,651 A   10/1997 Crane ....................... 333/22 R
5,898,326 A *  4/1999 Okayasu ..................... 327/112
5,977,819 A * 11/1999 Sanwo et al. ............... 327/563
6,208,161 B1 *  3/2001 Suda .......................... 326/30

FOREIGN PATENT DOCUMENTS

JP          58 062953 A     4/1983

* cited by examiner

Primary Examiner—Mohammad H. Ghayour
(74) Attorney, Agent, or Firm—Westman, Champlin & Kelly

(57) ABSTRACT

A data transmission circuit for transmitting a data stream includes a voltage supply terminal, a resistively terminated, controlled-impedance transmission line and an inductor coupled between the voltage supply terminal and the controlled-impedance transmission line.

16 Claims, 3 Drawing Sheets

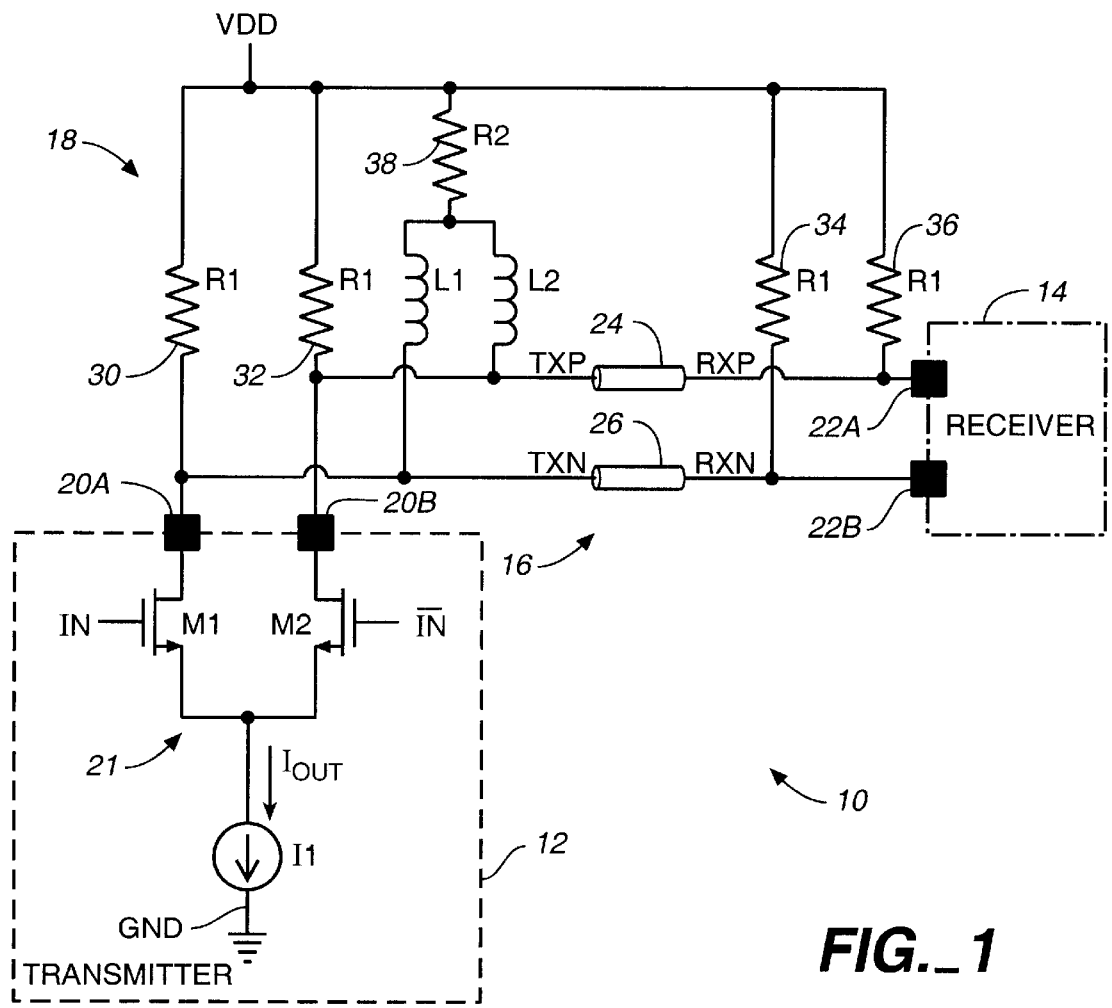
FIG._1

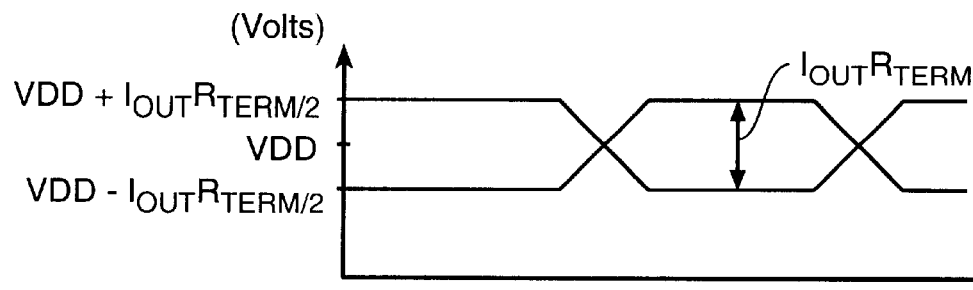
FIG._2A
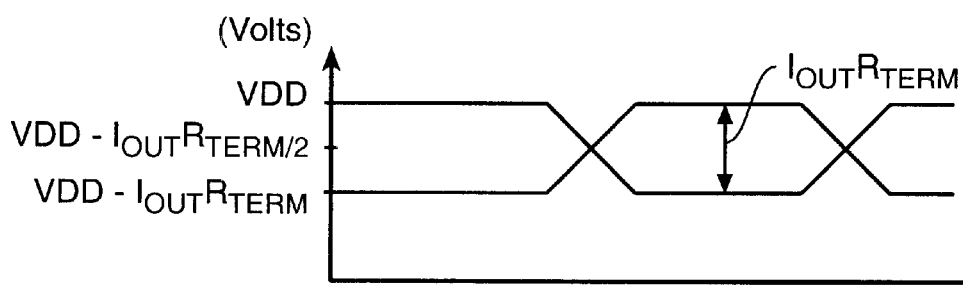
FIG._2B
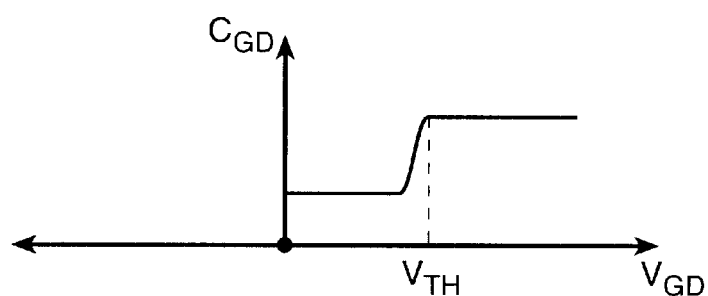
FIG._3

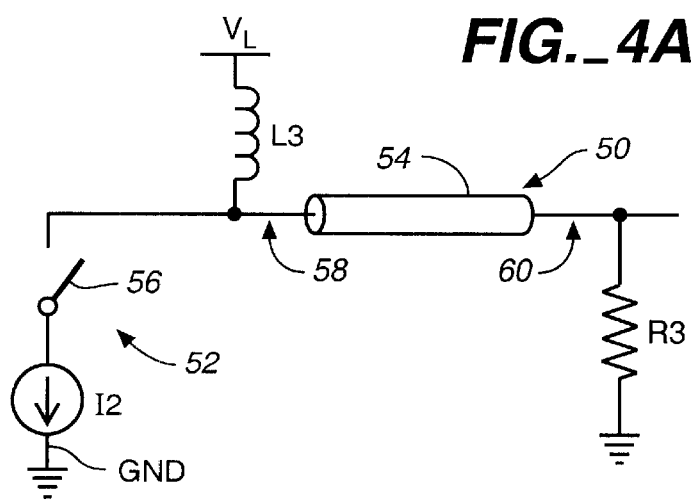
FIG._4A
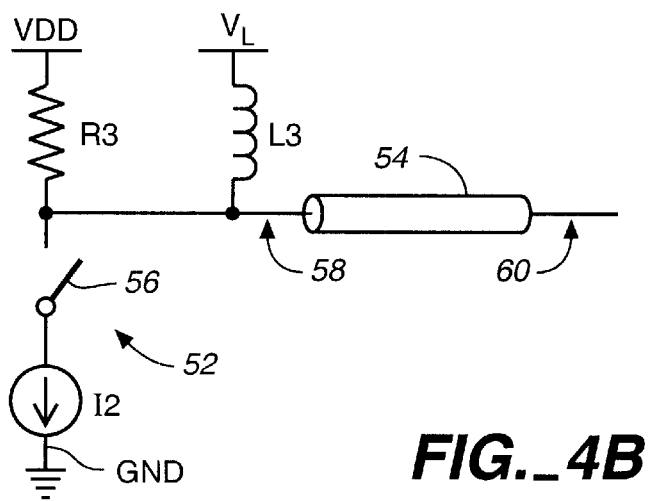
FIG._4B
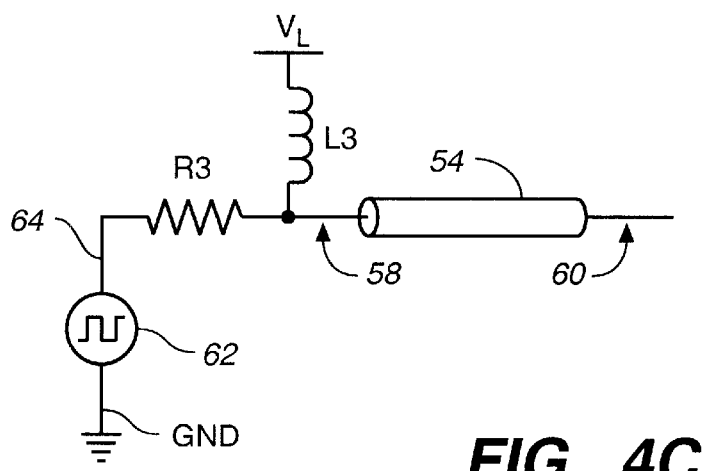
FIG._4C

TRANSMISSION CIRCUIT HAVING AN INDUCTOR-ASSISTED TERMINATION

CROSS-REFERENCE TO RELATED APPLICATION

This application claims the benefit of U.S. Provisional Application Serial No. 60/068,272, entitled "INDUCTOR-ASSISTED TERMINATION OF CONTROLLED-IMPEDANCE INTERCONNECT," filed Dec. 19, 1997.

BACKGROUND OF THE INVENTION

The present invention relates to high speed data transmission lines and, more particularly, to a controlled-impedance transmission line having an inductor-assisted termination network.

High-speed data transceivers transmit data from a transmitter to a receiver over a controlled-impedance transmission line. One or typically both ends of the transmission line are resistively terminated to a reference voltage such as a power supply terminal or a ground terminal. The total effective termination resistance is preferably matched to the impedance of the transmission line to minimize reflection and distortion of the transmitted data signals. Current-mode output drivers are often used to drive resistively-terminated transmission lines since they have a relatively high output resistance. The higher the output resistance, the less effect the output driver has on the total effective termination resistance, which allows for better transmission line impedance matching.

SUMMARY OF THE INVENTION

The data transmission circuit of the present invention includes a voltage supply terminal, a resistively-terminated, controlled-impedance transmission line and an inductor coupled between the voltage supply terminal and the transmission line.

Another aspect of the present invention relates to a data transmission circuit which includes a data transmitter, a data receiver and a transmission medium having a first end coupled to the data transmitter and a second end coupled to the data receiver. A termination resistance is coupled to at least one of the first and second ends. A termination inductance is coupled to at least one of the first and second ends.

Another aspect of the present invention relates to a method of terminating a data transmission line. The method includes coupling a termination resistor between a first termination voltage terminal and the transmission line and coupling a termination inductor between a second termination voltage terminal and the transmission line.

BRIEF DESCRIPTION OF THE DRAWINGS

FIG. 1 is a schematic diagram of a data transmission circuit having an inductively-assisted termination network according to one embodiment of the present invention.

FIG. 2A is a waveform diagram illustrating differential voltage levels in the transmission circuit shown in FIG. 1 with inductor-assisted termination.

FIG. 2B is a waveform diagram illustrating differential voltage levels in the transmission circuit shown in FIG. 1 without inductor-assisted termination.

FIG. 3 is a graph illustrating transistor gate-to-drain capacitance as a function of gate-to-drain voltage.

FIGS. 4A–4C are schematic diagrams of single-ended transmission circuits having inductor-assisted termination networks.

DETAILED DESCRIPTION OF THE PREFERRED EMBODIMENTS

FIG. 1 is a schematic diagram of a high speed data transmission circuit having an inductively-assisted termination network according to one embodiment of the present invention. Transmission circuit 10 includes transmitter 12, receiver 14, transmission media 16 and termination network 18. Transmitter 12 can include any data transmitter or transceiver, such as a Gigabit Ethernet transmitter defined by IEEE Draft P802.3z/D3.2 or a Fibre Channel Intercabinet transmitter defined by specification FC-PH-3, Revision 9.1, for example. In one embodiment, transmitter 12 is fabricated on an integrated circuit having output pads 20A and 20B. For simplicity, the details of transmitter 12 are not shown except for transmitter output buffer 21. Transmitter output buffer 21 is an open-drain output buffer formed by common-source transistors M1 and M2 and current source I1. Transistor M1 has a drain coupled to output pad 20A, a gate coupled to data input IN and a source coupled to current source I1. Transistor M2 has a drain coupled to output pad 20B, a gate coupled to data input $\overline{IN}$ and a source coupled to current source I1. Current source I1 is coupled between the sources of transistors M1 and M2 and ground terminal GND. Data inputs IN and $\overline{IN}$ are complementary data inputs which are generated by the internal logic (not shown) of transmitter 12.

Current source I1 sinks a current $I_{OUT}$ which is directed through transistor M1 or transistor M2 depending upon the relative logic states of the data signals applied to data inputs IN and $\overline{IN}$. This pulls the respective output pad 20A or 20B low toward ground terminal GND. The other output pad 20A or 20B is pulled high toward voltage supply terminal VDD through termination network 18. Complementary data signals applied to data inputs IN and $\overline{IN}$ are thereby converted to differential data signals at output pads 20A and 20B for transmission over transmission media 16.

Similar to transmitter 12, receiver 14 can include any data receiver or transceiver, such as a Gigabit Ethernet receiver defined by IEEE Draft P802.3z/D3.2 or a Fibre Channel Intercabinet receiver defined by specification FC-PH-3, Revision 9.1, for example. In one embodiment, receiver 14 is fabricated on an integrated circuit, which includes input pads 22A and 22B.

Transmission media 16 includes transmission lines 24 and 26, which can include metal traces, twisted wire pairs or coaxial cable, for example. Transmission line 24 has a first, "transmit" end TXP and a second, "receive" end RXP. Transmit end TXP is coupled to transmitter 12 at pad 20A, and receive end RXP is coupled to receiver 14 at input pad 22A. Similarly, transmission line 26 has a first, "transmit" end TXN and a second, "receive" end RXN. Transmit end TXN is coupled to transmitter 12 at pad 20B, and receive end RXN is coupled to receiver 14 at input pad 22B.

Inductor-assisted termination network 18 includes termination resistors 30, 32, 34 and 36, inductors L1 and L2 and resistor 38. Resistor 30 is coupled between voltage supply terminal VDD and transmit end TXN of transmission line 26. Termination resistor 32 is coupled between voltage supply terminal VDD and transmit end TXP of transmission line 24. Termination resistor 34 is coupled between voltage supply terminal VDD and receive end RXN of transmission line 26. Termination resistor 36 is coupled between voltage supply terminal VDD and receive end RXP of transmission line 24.

In the embodiment shown in FIG. 1, each of the termination resistors 30, 32, 34 and 36 have a resistance $R_1$, which is equal to the impedance of transmission lines 24 and 26. Termination resistors 30, 32, 34 and 36 are shown as being external to the integrated circuits on which transmitter 12 and receiver 14 are fabricated, but could be internal to the integrated circuits in alternative embodiments. Also, these termination resistors can be located at the transmit end only, the receive end only or at both the transmit and receive ends as shown in FIG. 1.

Inductor L1 is coupled between transmit end TXN and inductor bias voltage terminal $V_{MID}$. Inductor L2 is coupled between transmit end TXP and inductor bias voltage terminal $V_{MID}$. Resistor 38 is coupled between voltage supply terminal VDD and inductor bias voltage terminal $V_{MID}$. The inductances of inductors L1 and L2 are chosen such that when these elements are connected in parallel with termination resistors 30, 32, 34 and 36, the total effective termination impedance on each of the transmission lines 24 and 26 does not change appreciably at frequencies as low as the lowest frequency component of the data signals transmitted by transmitter 12. In one embodiment, the inductances of inductors L1 and L2 are chosen such that $Z_{L1 \text{ or } L2} > 10 R_1$, where $Z_{L1 \text{ or } L2}$ is the impedance of inductors L1 and L2 at the lowest frequency component of the data signal.

Resistor 38 has a resistance $R_2$. $R_2$ is chosen to adjust the high, low and common-mode voltage levels of the data signal transmitted by transmitter 12. The common mode voltage is the voltage on $V_{MID}$, which is given by the following equations, $$V_{MID} = V_{VDD} - I_{OUT} \frac{R_1 R_2}{R_1 + 4R_2} \qquad \text{Eq. 1}$$

$$= V_{VDD} - I_{OUT} \frac{R_1}{4 + R_1/R_2} \qquad \text{Eq. 2}$$

where $0 \leq R_2 \leq \infty$ and $R_{TERM} = R_1$.

With $R_2 = 0$, the common-mode voltage level is VDD. With $R_2 = \infty$ (an open circuit), the common-mode voltage level is $VDD - I_{OUT} R_1/4$. The common mode voltage level is typically selected to optimize the performance of receiver 14.

FIG. 2A is a waveform diagram illustrating the voltages on transmission lines 24 and 26 in the circuit shown in FIG. 1. When $R_2 = 0$, the output high voltage is $VDD + I_{OUT} R_1/4$. The output low voltage is $VDD - I_{OUT} R_1/4$. The common mode voltage (the average voltage) is VDD. The peak-to-peak voltage (the output high voltage minus the output low voltage) is $I_{OUT} R_1/2$.

FIG. 2B is a waveform diagram illustrating the voltages on transmission lines 24 and 26 if inductors L1 and L2 and resistor 38 were not present, as in traditional resistively-terminated transmission lines. The output high voltage is VDD. The output low voltage is $VDD - I_{OUT} R_1/2$. The common mode voltage is $VDD - I_{OUT} R_1/4$. The peak-to-peak voltage remains $I_{OUT} R_1/2$.

Therefore, adding inductors L1 and L2 to termination network 18 raises the output high voltage, the output low voltage, and the common mode voltage by as much as $I_{OUT} R_1/4$, depending on the value of resistance $R_2$.

Raising the common-mode voltage level on TXP and TXN provides two important advantages. First, transistors M1 and M2 operate further into saturation, which reduces the gate-to-drain capacitance of transistors M1 and M2. FIG. 3 is a graph illustrating the gate-to-drain capacitance $C_{GD}$ as a function of the gate-to-drain voltage $V_{GD}$ of transistors M1 and M2. As the common mode voltage levels at the drains of transistors M1 and M2 increase, $V_{GD}$ decreases. As $V_{GD}$ decreases to about the threshold voltage $V_{TH}$ of transistors M1 and M2, $C_{GD}$ decreases. And with a lower $C_{GD}$ for transistors M1 and M2, rise/fall times at TXP and TXN are reduced. Shorter rise/fall times will open the transmitter's data eye and reduce the bit error rate.

Second, since transistors M1 and M2 are operated further into saturation, the output resistance of transmitter 12 (due to the finite output resistance of transistors M1 and M2) is now higher. With a higher output resistance, better transmission line impedance matching is obtained through termination resistors 30, 32, 34 and 36 since the output resistance does not appreciably effect the total effective termination resistance.

The inductor-assisted termination network of the present invention can be used in certain single-ended transmission line applications in addition to a double-ended transmission line application, such as that shown in FIG. 1. FIGS. 4A–4C are schematic examples of single-ended transmission circuits having inductor-assisted termination networks according to various embodiments of the present invention. The same reference numerals are used in FIGS. 4A–4C for the same or similar elements. In FIG. 4A, transmission circuit 50 includes current-mode transmitter output buffer 52, single-ended transmission line 54, inductor L3 and termination resistor $R_3$. Current-mode transmitter 52 output buffer includes switch 56 and current source I2 which are coupled in series between transmit end 58 of transmission line 54 and ground terminal GND. Transmission line 54 is terminated through termination resistor $R_3$, which is coupled between receive end 60 of transmission line 54 and ground terminal GND. This type of termination is referred to as "far-end" termination. Inductor L3 assists in terminating transmission line 54 and is coupled between transmit end 58 and inductor bias voltage terminal $V_L$, similar to inductors L1 and L2 shown in FIG. 1.

In FIG. 4B, termination resistor $R_3$ is coupled between transmit end 58 of transmission line 54 and a voltage supply terminal VDD. This type of termination is referred to as "back-termination" or "source-termination". Inductor bias voltage terminal $V_L$ can be coupled to the same voltage supply or a different voltage supply than voltage supply terminal VDD, as desired.

In FIG. 4C, current-mode transmitter output buffer 52 is replaced with voltage-mode transmitter output buffer 62. Termination resistor $R_3$ is now coupled in series with voltage-mode transmitter output buffer 62, between transmit end 58 of transmission line 54 and output terminal 64 of output buffer 62. Inductor L3 remains coupled between transmit end 58 and inductor bias voltage terminal $V_L$. In the embodiments shown in FIGS. 4A–4C, a resistor, similar to resistor 38 shown in FIG. 1, can be coupled in series with inductor L3, between source end 58 and inductor bias voltage terminal VL. Also, inductor L3 can be coupled to transmit end 58 only, receive end 60 only or separate inductors can be coupled to the transmit end 58 and the receive end 60.

The inductor-assisted termination network of the present invention allows an increase in the output high voltage, output low voltage and common-mode output voltage in high speed data transmission applications. As discussed above, this has particular advantages with open-drain, current mode output drivers since increasing these voltage levels results in a reduction of the gate-to-drain capacitance of the output driver transistors and an increase in their output resistance. Increasing these voltages also has advantages when used with low-voltage integrated circuit applications. Advancements in semiconductor integrated circuit fabrication technology have enabled the geometries of semiconductor devices to be progressively reduced so that more devices can fit on a single integrated circuit. As a result, core voltages of the integrated circuits are being reduced to prevent damage to the small devices and to reduce overall power consumption. For example, power supplies are now being reduced from 5 V to 3.3 V, and from 3.3 V to 2.5 V and below. However, these circuits often need to interface at higher voltage levels. For example, the Gigabit Ethernet specification requires the transmitter to transmit data streams with minimum differential amplitudes of 1100 mV. The Fibre Channel specification requires the transmitter to transmit data streams with minimum differential amplitudes of 600 mV. Inductor-assisted termination optimizes the biasing of the transmitter so that greater differential amplitudes may be achieved.

Although the present invention has been described with reference to preferred embodiments, workers skilled in the art will recognize that changes may be made in form and detail without departing from the spirit and scope of the invention. For example, transmission circuit of the present invention can be used with other types of termination networks, such as an AC-coupled receiver termination network. Also, the voltage supply terminals can be relatively positive or relatively negative, depending upon the particular convention adopted and the technology used. The term "coupled" can include various types of connections or couplings and can include a direct connection or a connection through one or more intermediate components.

What is claimed is:

1. A data transmission circuit for transmitting a data stream, the transmission circuit comprising:
   a voltage supply terminal;
   a first resistively-terminated, controlled-impedance transmission line;
   a first inductor coupled between the voltage supply terminal and the first controlled-impedance transmission line;
   a second resistively terminated, controlled-impedance transmission line, wherein the first and second transmission lines together form a differential transmission line; and
   a second inductor coupled between the voltage supply terminal and the second transmission line.

2. The data transmission circuit of claim 1 and further comprising a resistor coupled in series with the first inductor, between the voltage supply terminal and the first transmission line.

3. The data transmission circuit of claim 2 wherein the data stream has a lowest frequency component and wherein:
   the first transmission line comprises first and second ends and a termination resistance coupled to at least one of the first and second ends; and
   the first inductor has an impedance at the lowest frequency component that is at least ten times the termination resistance.

4. The data transmission circuit of claim 1 and further comprising:
   a resistor coupled between the voltage supply terminal and the first and second inductors.

5. The data transmission circuit of claim 4 and further comprising:
   a second voltage supply terminal;
   a first termination resistor coupled between the second voltage supply terminal and the first transmission line; and
   a second termination resistor coupled between the second voltage supply terminal and the second transmission line.

6. The data transmission circuit of claim 5 wherein the first and second voltage supply terminals are coupled to one another.

7. A data transmission circuit comprising:
   a data transmitter;
   a data receiver;
   a transmission medium comprising first and second transmission lines, each transmission line having a first end coupled to the data transmitter and a second end coupled to the data receiver;
   a termination resistance comprising a first resistor coupled to one of the first and second ends of the first transmission line and a second resistor coupled to one of the first and second ends of the second transmission line; and
   a termination inductance comprising a first inductor coupled to one of the first and second ends of the first transmission line and a second inductor coupled to one of the first and second ends of the second transmission line.

8. The data transmission circuit of claim 7 and further comprising:
   a first voltage supply terminal; and
   a third resistor coupled between the first voltage supply terminal and the first inductor and between the first voltage supply terminal and the second inductor.

9. The data transmission circuit of claim 7 wherein the data transmitter transmits a data stream having a lowest frequency component and wherein:
   the first and second inductors have impedances at the lowest frequency component that are at least ten times the termination resistance.

10. The data transmission circuit of claim 7 wherein the data transmitter comprises:
    an open-drain, current-mode output buffer coupled to the first end of the transmission medium.

11. The data transmission circuit of claim 9 wherein the data transmitter comprises a voltage-mode output buffer coupled to the first end of the transmission medium.

12. The data transmission circuit of claim 9 wherein:
    the data transmitter is fabricated on a first integrated circuit;
    the data receiver is fabricated on a second integrated circuit;
    the transmission medium is coupled between the first and second integrated circuits.

13. A method of terminating a differential data transmission line formed by first and second transmission lines, the method comprising:
    coupling a first termination resistor between a first termination voltage terminal and the first transmission line;
    coupling a second termination resistor between a second termination voltage terminal and the second transmission line;
    coupling a first termination inductor between a second termination voltage terminal and the first transmission line; and
    coupling a second termination inductor between the second termination voltage terminal and the second transmission line.

14. A transmission circuit comprising:

a data transmitter;

a data receiver;

a differential transmission medium comprising first and second transmission lines, each transmission line having a first end coupled to the transmitter and a second end coupled to the receiver;

means for resistively terminating each of the first and second transmission lines; and means for inductively terminating each of the first and second transmission lines.

15. A data transmission circuit comprising:

a data transmitter, which comprises a voltage-mode output buffer and is adapted to transmit a data stream having a lowest frequency component;

a data receiver;

a transmission medium having a first end coupled to the voltage-mode output buffer of the data transmitter and a second end coupled to the data receiver;

a termination resistance coupled to at least one of the first and second ends; and a termination inductance coupled to at least one of the first and second ends and having an impedance at the lowest frequency component, which is large enough that the transmission medium has a total effective termination impedance substantially equal to the termination resistance.

16. A data transmission circuit comprising:

a data transmitter, which is adapted to transmit a data stream having a lowest frequency component and is fabricated on a first integrated circuit;

a data receiver, which is fabricated on a second integrated circuit;

a transmission medium coupled between the first and second integrated circuits and having a first end coupled to the data transmitter and a second end coupled to the data receiver;

a termination resistance coupled to at least one of the first and second ends; and a termination inductance coupled to at least one of the first and second ends and having an impedance at the lowest frequency component, which is large enough that the transmission medium has a total effective termination impedance substantially equal to the termination resistance.

* * * * *